(12) United States Patent  
Jung

(10) Patent No.: US 10,848,876 B2  
(45) Date of Patent: Nov. 24, 2020

(54) MEMS MICROPHONE, METHOD OF MANUFACTURING THE SAME AND MEMS MICROPHONE PACKAGE INCLUDING THE SAME

(71) Applicant: DB HITEK CO., LTD., Seoul (KR)

(72) Inventor: Min Hyun Jung, Chungcheongbuk-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/403,074

(22) Filed: May 3, 2019

(65) Prior Publication Data

US 2019/0342670 A1    Nov. 7, 2019

(30) Foreign Application Priority Data

May 3, 2018    (KR) .................. 10-2018-0051203

(51) Int. Cl.
| | |
|---|---|
| *H04R 19/04* | (2006.01) |
| *B81B 7/00* | (2006.01) |
| *B81B 7/02* | (2006.01) |
| *B81C 1/00* | (2006.01) |

(52) U.S. Cl.
CPC .......... *H04R 19/04* (2013.01); *B81B 7/0032* (2013.01); *B81B 7/02* (2013.01); *B81C 1/00039* (2013.01); *B81C 1/00047* (2013.01); *B81C 1/00158* (2013.01); *B81B 2201/0257* (2013.01); *B81B 2203/0127* (2013.01); *B81B 2203/0307* (2013.01); *B81B 2203/0315* (2013.01); *B81B 2207/09* (2013.01)

(58) Field of Classification Search
CPC ......... H04R 19/04; B81B 7/0032; B81B 7/02; B81C 1/00039; B81C 1/00047; B81C 2201/0257; B81C 2203/0307; B81C 2203/0315

See application file for complete search history.

(56) References Cited

U.S. PATENT DOCUMENTS

| | | | | |
|---|---|---|---|---|
| 2009/0208037 | A1* | 8/2009 | Zhe | H04R 19/005 381/174 |
| 2010/0065930 | A1* | 3/2010 | Nakatani | H01L 28/40 257/415 |
| 2010/0158279 | A1* | 6/2010 | Conti | H04R 7/24 381/174 |
| 2012/0213400 | A1* | 8/2012 | Kasai | H04R 19/04 381/369 |
| 2017/0311088 | A1* | 10/2017 | Sun | H04R 19/005 |

* cited by examiner

*Primary Examiner* — Sunita Joshi  
(74) *Attorney, Agent, or Firm* — Patterson Thuente; Pedersen, P.A.

(57) ABSTRACT

A MEMS microphone includes a cavity extending portion that increases the size of the cavity. The cavity extending portion can be sloped or stepped in order to create a desired profile of the extended cavity shape. Thus, the volume of the cavity may be increased in order to decrease the compliance and to increase a Signal to Noise Ratio.

13 Claims, 13 Drawing Sheets

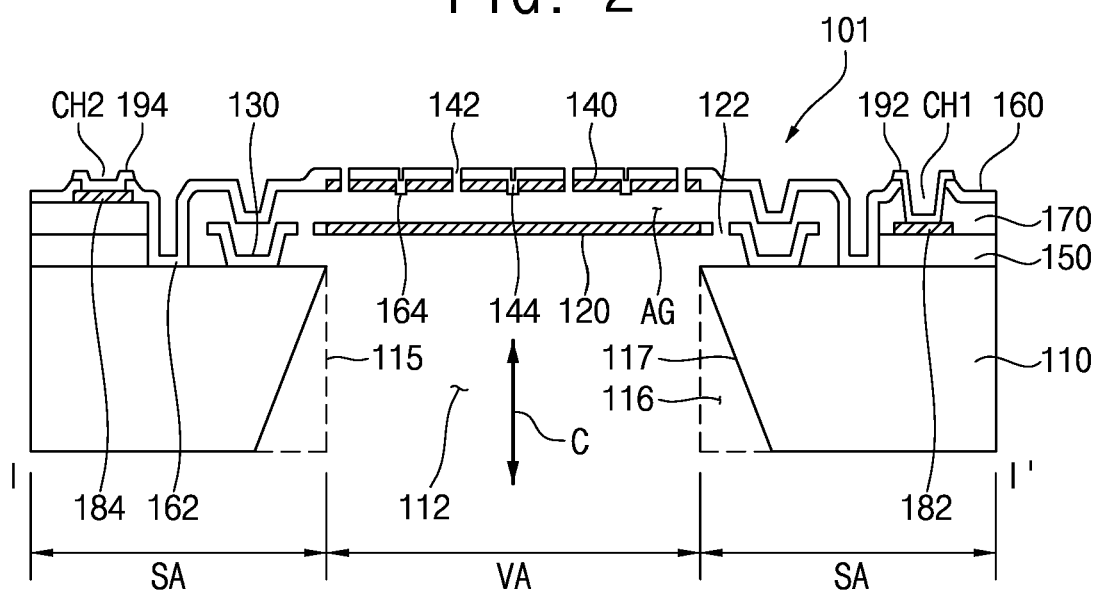
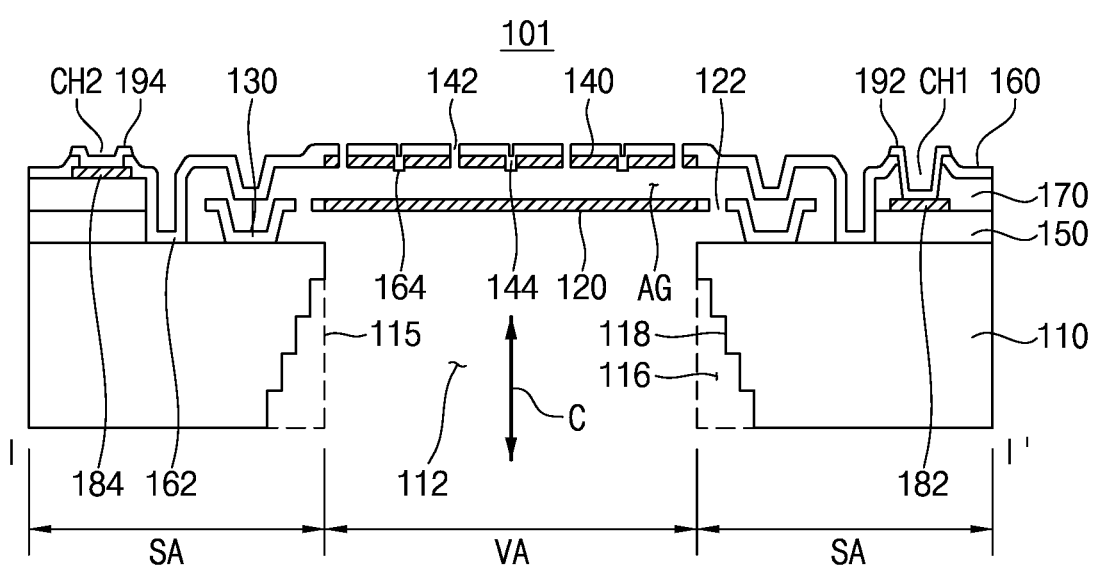

MEMS MICROPHONE, METHOD OF MANUFACTURING THE SAME AND MEMS MICROPHONE PACKAGE INCLUDING THE SAME

CROSS-REFERENCE TO RELATED APPLICATION

This application claims priority to Korean Patent Application No. 10-2018-0051203, filed on May 3, 2018, and all the benefits accruing therefrom under 35 U.S.C. § 119, the contents of which are incorporated by reference in their entirety.

TECHNICAL FIELD

The present disclosure relates to a Micro Electro Mechanical Systems (MEMS) microphone capable of converting an acoustic wave into an electrical signal, a method of manufacturing the MEMS microphone, and a MEMS microphone package including the MEMS microphone. More particularly, the present disclosure relates a capacitive MEMS microphone being capable of transforming an acoustic wave into an electric signal using a displacement of a diaphragm which occurs due to an acoustic pressure, a method of manufacturing such a MEMS microphone, and a MEMS microphone package including such MEMS microphone.

BACKGROUND

Generally, a capacitive microphone utilizes a capacitance between a pair of electrodes which are facing each other to detect an acoustic wave. The capacitive microphone includes a diaphragm and a back plate. The diaphragm may respond to an acoustic pressure to be configured to be bendable. A back plate may face the diaphragm.

The diaphragm may have a membrane structure to perceive an acoustic pressure to generate a displacement. In particular, when the acoustic pressure is applied to the diaphragm, the diaphragm may be bent toward the back plate due to the acoustic pressure. The displacement of the diaphragm may be perceived through a value change of capacitance formed between the diaphragm and the back plate. As a result, an acoustic wave may be converted into an electrical signal for output.

The capacitive microphone may be manufactured by a semiconductor MEMS process such that the capacitive microphone has a MEMS type having an ultra-small size, which is referred as MEMS microphone. The diaphragm is spaced apart from a substrate including a cavity so that the diaphragm can be freely bent upwardly or downwardly in accordance with the acoustic pressure. The MEMS microphone has an anchor provided at a peripheral portion of the diaphragm. The anchor makes contact with the substrate to stably support the diaphragm from the substrate.

When the MEMS microphone is applied to a MEMS microphone package having a top port type, the cavity may serve as a back chamber. Thus, a volume of the cavity may function as a factor of determining a compliance of MEMS microphone package. Thus, the volume of the cavity may be required to increase in order to decrease the compliance and to increase a Signal to Noise Ratio (hereinafter, referred as "SNR").

SUMMARY

The example embodiments of the present invention provide a MEMS microphone capable of having a decreased compliance and an improved SNR.

The example embodiments of the present invention provide a method of manufacturing a MEMS microphone capable of having a decreased compliance and an improved SNR.

The example embodiments of the present invention provide a MEMS microphone package including a MEMS microphone capable of having a decreased compliance and an improved SNR.

According to an example embodiment of the present invention, a MEMS microphone includes a substrate having a cavity defined by a first sidewall extending a vertical direction, a back plate disposed over the substrate and having a plurality of acoustic holes, a diaphragm disposed between the substrate and the back plate, the diaphragm being spaced apart from the substrate and the back plate to cover the cavity, the diaphragm sensing an acoustic pressure to generate a displacement and an anchor extending from a circumference of the diaphragm to connecting an end portion of the diaphragm to an upper surface of the substrate, the anchor being connected with the upper surface of the substrate to support the diaphragm, and a cavity extending portion communicating with the cavity to enlarge a volume of a space defined by the cavity and the cavity extending portion.

In an example embodiment, the anchor has a ring shape to surround the diaphragm.

In an example embodiment, the cavity extending portion includes a second sidewall being inclined and being downwardly more distant from a center line of the cavity.

In an example embodiment, the cavity extending portion includes a second sidewall adjacent to the first sidewall, the second sidewall having a plurality of stepped portions which are downwardly more distant from a center line of the cavity.

In an example embodiment, the anchor is formed in plural, a plurality of anchors is spaced apart from each other and is arranged along a circumference of the diaphragm, and a plurality of slits are disposed between two adjacent anchors.

Here, the cavity extending portion includes a third sidewall adjacent to the first sidewall, the third sidewall being disposed below the slits.

Further, the third sidewall is inclined to be downwardly more distant from a center line of the cavity.

According to an example embodiment of the present invention, a method of manufacturing a MEMS microphone is disclosed. An insulation layer is formed on a substrate being divided into a vibration area and a peripheral area surrounding the vibration area. The insulation layer is patterned to form an anchor hole for forming an anchor in the peripheral area, the anchor hole extending along a circumference of the vibration area. A diaphragm and an anchor is formed on the insulation layer through which the anchor hole is formed, the anchor connecting the diaphragm to the substrate. A sacrificial layer is formed on the insulation layer to cover the diaphragm and the anchor. A back plate is formed on the sacrificial layer to face the diaphragm. The back plate is patterned to form a plurality of acoustic holes which penetrates through the back plate. The substrate is patterned to form a cavity defined by a first sidewall in the vibration area. A cavity extending portion communicating with the cavity is formed to enlarge a volume of a space defined by the cavity and the cavity extending portion. A portion of the insulation layer, which is located under the diaphragm, is removed through an etching process using the cavity as a mask and A portion of the sacrificial layer, which corresponds to the diaphragm and the anchor, is removed.

In an example embodiment, the anchor hole is formed in a ring shape to surround the vibration area, forming the diaphragm comprises forming a plurality of vent holes in the peripheral area, and the vent holes serves as a flow path of etchant for removing the portion of the sacrificial layer.

In an example embodiment, forming the cavity extending portion comprises forming a second sidewall being inclined and being downwardly more distant from a center line of the cavity.

In an example embodiment, forming the cavity extending portion comprises forming a second sidewall adjacent to the first sidewall, the second sidewall having a plurality of stepped portions which are downwardly more distant from a center line of the cavity.

In an example embodiment, the anchor is formed in plural, a plurality of anchors is spaced apart from each other and is arranged along a circumference of the vibration area, forming the diaphragm comprises forming a plurality of slits between two adjacent anchors and in the peripheral area, and forming the cavity extending portion comprises removing a portion of the substrate, positioned under the slits.

In an example embodiment, the cavity and the cavity extending portion are in-situ formed.

According to an example embodiment of the present invention, a MEMS microphone package includes a substrate having a cavity defined by a first sidewall extending a vertical direction, a back plate disposed over the substrate and having a plurality of acoustic holes, a diaphragm disposed between the substrate and the back plate, the diaphragm being spaced apart from the substrate and the back plate to cover the cavity, the diaphragm sensing an acoustic pressure to generate a displacement, an anchor extending from a circumference of the diaphragm to connecting an end portion of the diaphragm to an upper surface of the substrate, the anchor being connected with the upper surface of the substrate to support the diaphragm, a cavity extending portion communicating with the cavity to enlarge a volume of a space defined by the cavity and the cavity extending portion and a package portion entirely surrounding the substrate, the back plate, the diaphragm, the anchor and the cavity extending portion, the package portion including a top port which provides a flow path for an acoustic pressure.

In an example embodiment, the cavity extending portion includes a second sidewall being inclined and being downwardly more distant from a center line of the cavity.

In an example embodiment, the cavity extending portion includes a second sidewall adjacent to the first sidewall, the second sidewall having a plurality of stepped portions which are downwardly more distant from a center line of the cavity.

In an example embodiment, the anchor is formed in plural, a plurality of anchors is spaced apart from each other and is arranged along a circumference of the diaphragm, and a plurality of slits are disposed between two adjacent anchors.

In an example embodiment, the cavity extending portion includes a third sidewall adjacent to the first sidewall, the third sidewall being disposed below the slits.

According to example embodiments of the present invention as described above, the MEMS microphone includes a cavity extending portion adjacent to the first sidewall of the cavity and communicating with the cavity. The cavity extending portion may communicate with the cavity, thereby enlarging the volume of the space defined by the cavity and the cavity extending portion. That is, when the space occupied by the cavity and the cavity extending portion is used as a back chamber, the volume of the back chamber may be increased. That is, when the MEMS microphone is packaged in a top port manner, the space defined by the cavity and the cavity extending portion functions as a back chamber. At this time, as the volume of the back chamber is increased, the signal to noise ratio (SNR) may be improved while reducing the compliance.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which:

FIG. 2 is a cross sectional view taken along a line I-I' in FIG. 1;

FIG. 3 is a cross sectional view illustrating a MEMS microphone in accordance with an embodiment of the present invention;

Figure 1:
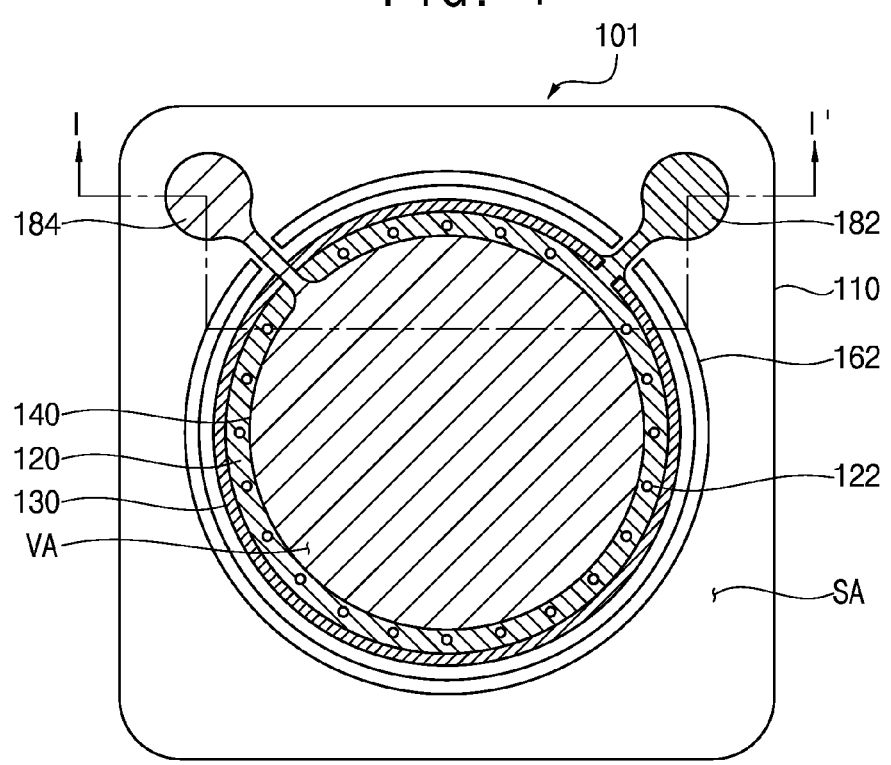
FIG. 1 is a plan view illustrating a MEMS microphone in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

FIG. 1 is a plan view illustrating a MEMS microphone in accordance with an embodiment of the present invention. FIG. 2 is a cross sectional view taken along a line I-I' in FIG. 1.

Referring to FIGS. 1 and 2, a MEMS microphone 101 in accordance with an example embodiment of the present invention includes a substrate 110, a diaphragm 120, an anchor 130, a back plate 140 and a cavity extending portion 116. The MEMS microphone 101 is capable of generating a displacement in response to an acoustic pressure to convert an acoustic signal into an electrical signal and output the electrical signal.

The substrate 110 is divided into a vibration area VA and a peripheral area SA. In the vibration area VA, a cavity 112 penetrating through the substrate in a vertical direction is formed.

In an example embodiment, a first sidewall 115 may define the cavity 112. The first sidewall 115 extends a vertical direction. The vibration area VA may correspond to the cavity 112.

The diaphragm 120 may have a membrane structure. The diaphragm 120 may be positioned over the substrate 110 to cover the cavity 112, and the diaphragm 120 may be exposed to the cavity 112. The diaphragm 120 is spaced apart from the substrate 110 to be configured to be bendable in response to an acoustic pressure. The diaphragm 120 may have an ion implantation region into which impurities such III element or V elements are doped. The ion implantation region may correspond to the vibration area VA.

In an example embodiment, the diaphragm 120 may have a shape of a disc plate, as shown in FIG. 1 and the cavity 112 may have a circular or cylindrical shape.

The anchor 130 is positioned at an end portion of the diaphragm 120. The anchor 120 supports the diaphragm 120 which is spaced apart from the substrate 110. The anchor 130 is positioned in the peripheral area SA of the substrate 110. The anchor 130 may have a lower face to make contact with an upper face of the substrate 110. The anchor 130 may extend along a circumference of the diaphragm 120 to surround the vibration area VA.

In an example embodiment of the present invention, the anchor 130 may have a ring shape. The anchor may have a dam shape: that is, a section of the anchor 130 along the vertical direction may have a U-shape, as shown in FIG. 2.

The back plate 140 may be positioned over the diaphragm 120 as shown in FIG. 2. The back plate 140 may be disposed in the vibration area VA. The back plate 140 is spaced apart from the diaphragm 120 and faces the diaphragm 120. Like the diaphragm 120, the back plate 140 may have a disc shape.

The back plate 140 may be spaced apart from the diaphragm 120 to form an air gap AG.

In an embodiment, the diaphragm 120 may have a plurality of vent holes 122. The vent holes 122 may serve as a path for the acoustic wave which flows between the air gap AG and the cavity 112. Thus, the vent holes 122 may control a pressure balance between the cavity 112 and the air gap AG. Further, the vent holes 122 may prevent the diaphragm 120 from being damaged by the acoustic pressure applied externally to the diaphragm 120.

The vent holes 122 are positioned along the peripheral area SA. The vent holes 122 may be arranged along the anchor 130 and may be spaced apart from one another, as shown in FIG. 1. The vent holes 122 may penetrate through the diaphragm 120, as shown in FIG. 2.

The cavity extending portion 116 is positioned adjacent to the first sidewall 115 and fluidically communicates with the cavity 112 such that the cavity 112 and the cavity extending portion 116 form a common space for vibration therein. The cavity extending portion 116 communicates with the cavity 112 to increase a volume of a space defined by the cavity 112 and the cavity extending portion 116. That is, when the space defined by the cavity 112 and the cavity extending portion 116 is used as a back chamber for a MEMS microphone package, a volume of the back chamber may be increased. Thus, when the MEMS microphone 101 is implemented in a MEMS microphone package having a top port structure, the space defined by the cavity 112 and the cavity extending portion 116 functions as the back chamber. As the volume of the back chamber is increased, the SNR value may increase while reducing the compliance.

In the embodiment shown in FIG. 2, the cavity 112 defines a center line C. The center line C extends perpendicular to the diaphragm 120. As shown in FIG. 2, the cavity extending portion 116 is sloped so that, as it travels downwardly with respect to the center line C, the second sidewall 118 becomes more distant from the center line C of the cavity 112.

In one embodiment of the present invention, the cavity extending portion 116 may have a second sidewall 117 which is inclined against the first sidewall 115. The second sidewall 117 gradually goes distant from a center of the cavity 112 as the second sidewall 117 goes down from an upper surface of the substrate 110.

In some example embodiments, such as the embodiment shown in FIG. 2, the MEMS microphone 101 may further include a first insulation layer 150, a second insulation layer 160, an insulating interlayer 170, a diaphragm pad 182, a back plate pad 184, a first pad electrode 192 and a second pad electrode 194.

In particular, the first insulation layer 150 may be formed on the upper surface of the substrate 110 and may be located in the peripheral area SA.

The second insulation layer 160 may be disposed over the substrate 110. The second insulation layer 160 may cover a top surface of the back plate 140. The second insulation layer 160 may include a portion bent from outside of the back plate 140 to form a chamber portion 162 having a section of a "U" shape. The chamber portion 162 may be located in the peripheral area SA.

As shown in FIG. 1, the chamber portion 162 may be spaced apart from the anchor 130 and may have a ring shape so as to surround the anchor 130. The second insulation layer 160 is spaced apart from the diaphragm 120 and the anchor 130 to additionally form the air gap AG between the diaphragm 120 and the back plate 140. Therefore, the air gap AG may have an increased volume.

The chamber portion 162 makes contact with the upper surface of the substrate 110 such that the second insulation layer 160 having the chamber portion 162 may support the back plate 140 which is coupled to a lower face of the second insulation layer 160. As a result, the back plate 140 may be kept apart from the diaphragm 120 to maintain the air gap AG.

A plurality of acoustic holes 142 is formed through the back plate 140 and the second insulation layer 160 such that acoustic pressure passes through the acoustic holes 142. The acoustic holes 142 penetrate through the back plate 140 and the second insulation layer 160 and may communicate with the air gap AG.

In an example embodiment, the back plate 140 may have a plurality of dimple holes 144, and the second insulation layer 160 may have a plurality of dimples 164 positioned to correspond to those of the dimple holes 144. The dimple holes 144 penetrate through the back plate 140, and the dimples 164 are provided at positions where the dimple holes 144 are formed.

The dimples 164 may prevent the diaphragm 120 from being coupled to a lower face of the back plate 140. That is, when sound reaches the diaphragm 120, the diaphragm 120 can be bent in a semicircular shape toward the back plate 140, and then can return to its initial position. A bending degree of the diaphragm 120 may vary depending on the sound pressure and may be increased to such an extent that an upper face of the diaphragm 120 makes contact with the lower face of the back plate 140. When the diaphragm 120 is bent so much as to contact the back plate 140, the diaphragm 120 may attach to the back plate 140 and may not return to the initial position.

According to example embodiments, the dimples 164 may protrude from the lower face of the back plate 140 toward the diaphragm 120. Even when the diaphragm 164 is severely bent (e.g., so much that the diaphragm 120 contacts the back plate 140), the dimples 164 separate the diaphragm 120 and the back plate 140 from one another so that the diaphragm 120 can return to the initial position rather than becoming stuck in contact with one another more permanently.

The diaphragm pad 182 may be formed on the upper face of the first insulation layer 150. The diaphragm pad 182 may be electrically connected to the diaphragm 120.

The insulating interlayer 170 may be formed on the first insulation layer 150 having the diaphragm pad 182. The insulating interlayer 170 is disposed between the first insulation layer 150 and the second insulation layer 160, and is located in the peripheral area SA. Here, the first insulation layer 150 and the insulating interlayer 170 may be located outside from the chamber portion 162, as shown in FIG. 2.

The back plate pad 184 may be formed on an upper face of the insulating interlayer 170. The back plate pad 184 is electrically connected to the back plate 140 and may be located in the peripheral area SA.

The diaphragm pad 182 is exposed through a first contact hole CH1 formed by partially removing the second insulation layer 160 and the insulating interlayer 170. The back plate pad 184 is exposed through a second contact hole CH2 formed by partially removing the second insulation layer 160.

The first and second pad electrodes 192 and 194 may be formed on the second insulation layer 160. The first pad electrode 192 is located in the first contact hole CH1 to make contact with the diaphragm pad 182. On other hands, the second pad electrode 194 is located in the second contact hole CH2 and makes contact with the back plate pad 184. Here, the first and second pad electrodes 192 and 194 may be transparent electrodes.

FIG. 3 is a cross sectional view illustrating a MEMS microphone 101 in accordance with an embodiment of the present invention. Throughout the application, the same reference numeral will be used to refer to components that are substantially similar to one another in the various drawings.

Referring to FIGS. 1 and 3, a cavity extending portion 116 may have a second sidewall 118 stepped away from the center of the cavity 112 to have a plurality of step portions along the first sidewall 115. As the cavity extending portion 116 has the stepped second side wall 118, the path through which the acoustic wave flows via the cavity extending portion 116 may be adjusted. That is, either a number or a height of the step portions provided in the cavity extending portion 116 is controlled, so that characteristics of the MEMS microphone 101 may be controlled.

In other words, when the space defined by the cavity 112 and the cavity extending portion 116 are used as a back chamber of the MEMS microphone package, a volume of the back chamber may be increased. That is, when the MEMS microphone 101 is implemented to a package having a top port manner, the cavity 112 and the cavity extending portion 116 may function as the back chamber of the MEMS microphone package. As the volume of the back chamber increases, increasing the signal-to-noise (SNR) ratio while reducing the compliance may be achieved.

Similarly to FIG. 2, the cavity 112 of FIG. 3 defines a center line C. The center line C extends perpendicular to the diaphragm 120. As shown in FIG. 3, the cavity extending portion 116 is stepped so that, as it travels downwardly with respect to the center line C, the second sidewall 118 becomes more distant from the center line C of the cavity 112.

Figure 4:
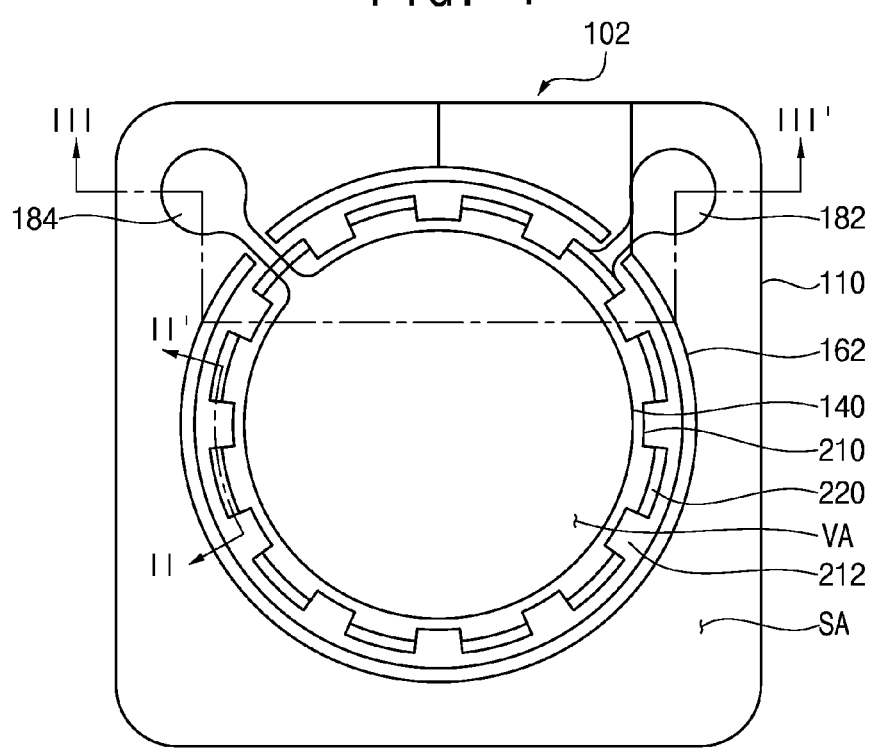
FIG. 4 is a plan view illustrating a MEMS microphone in accordance with an embodiment of the present invention.
Figure 5:
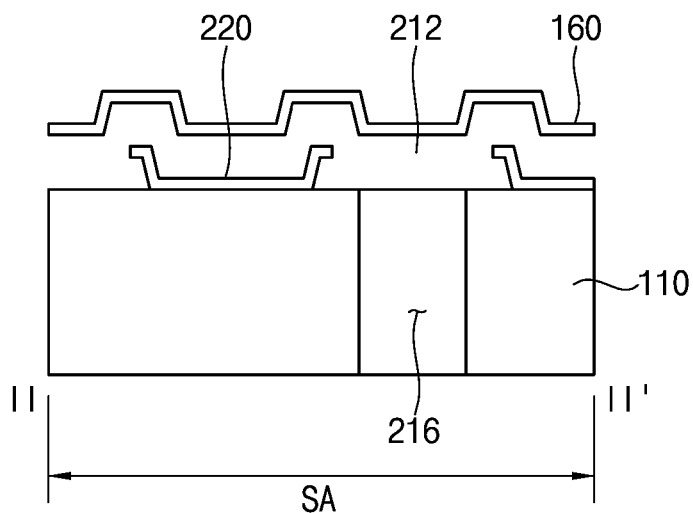
FIG. 5 is a cross sectional view taken along a line II-II' in FIG. 4.
Figure 6:
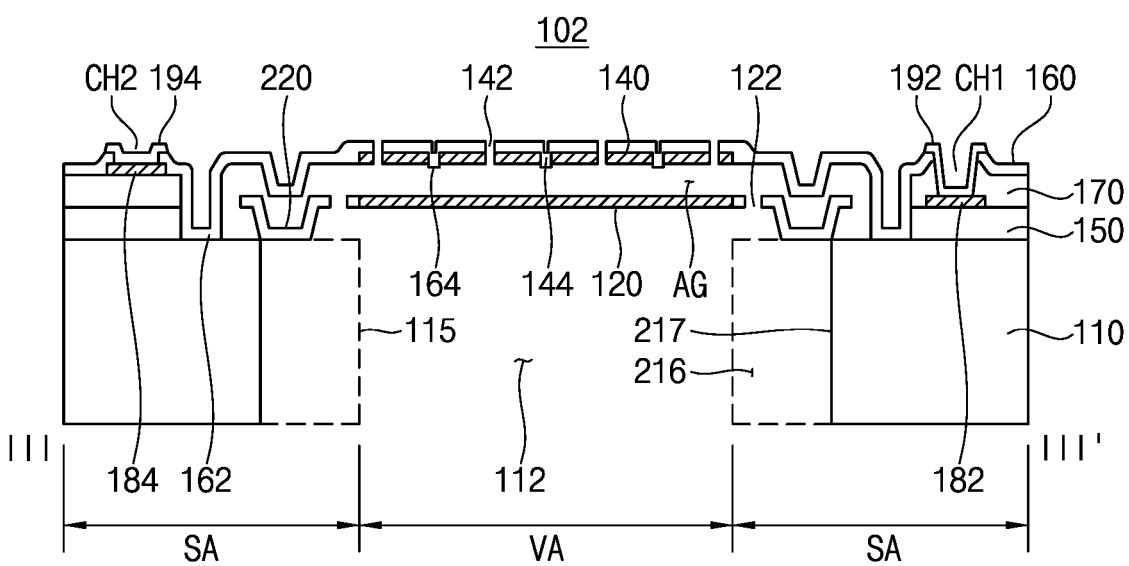
FIG. 6 is a cross sectional view taken along a line III-III' in FIG. 4.

FIG. 4 is a plan view illustrating a MEMS microphone 102 in accordance with an embodiment of the present invention. FIG. 5 is a cross sectional view taken along a line II-II' in FIG. 4. FIG. 6 is a cross sectional view taken along a line III-III' in FIG. 4.

Referring to FIGS. 4 to 6, a MEMS microphone 102 according to an example embodiment of the present invention is identical to the MEMS microphone 101 in FIGS. 1 and 2 except for a diaphragm 210, anchors 220 and a cavity extending portion 216. The same elements as those of the MEMS microphone 101 shown in FIG. 1 will not be described again with respect to MEMS microphone 102.

Specifically, the diaphragm 210 may be provided over a substrate 110, and the anchors 220 may be formed to be adjacent to an end of the diaphragm 210.

The anchors 220 may be formed in a plurality of positions, and the anchors 220 may be located in a peripheral area SA. As shown in FIG. 4, the anchors 220 may be spaced apart from one another along a circumference of the diaphragm 210, and may be arranged along the circumference of the diaphragm 210. Each of the anchors may have a dam shape.

The diaphragm 210 may have a plurality of slits 212 which are positioned between the anchors 220. As shown in FIG. 5, the slits 212 are positioned between each pair of adjacent anchors. The MEMS microphone 102 includes a plurality of the anchors 220 to stably support the diaphragm 120.

Further, each of the slits 212 may serve as a flow path along which the acoustic wave flows.

The cavity extending portion 216 includes a third sidewall 217 formed under the slits 212 in a direction away from the center of the cavity 112 from the first sidewall 115. That is, the cavity extending portion 216 is formed under each of the slits 212. Accordingly, the cavity extending portion 216 is provided under each of the slits 212, and the first side wall 115 of the substrate 110 is provided under each of the anchors 220.

As a result, the cavity extending portion 216 is provided at all of areas of the first sidewall 115 of the substrate 110 except for the portion where the anchors 220 are connected to the substrate 110, such that the space formed by the cavity extending portion 216 may be enlarged.

Figure 7:
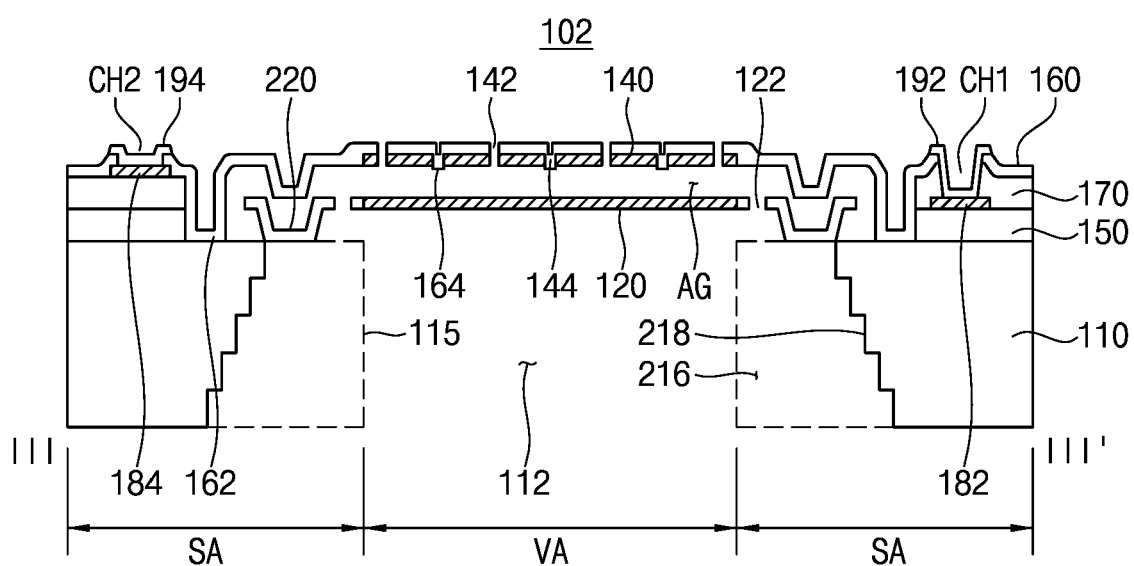
FIG. 7 is a cross sectional view illustrating a MEMS microphone in accordance with an embodiment of the present invention.

FIG. 7 is a cross sectional view illustrating a MEMS microphone 102 in accordance with an embodiment of the present invention.

Referring to FIGS. 4 and 7, a cavity extending portion 216 may have a second sidewall 118 stepped away from the center of the cavity 112 to have a plurality of step portions along the first sidewall 115. As the cavity extending portion 216 has the stepped second side wall 218, the path of the acoustic pressure flowing through the cavity extending portion 216 may be adjusted. That is, a number of step portions or a height thereof can be controlled by modifying the extending portion 216, so that characteristics of the MEMS microphone 102 may be controlled.

Hereinafter, a method of manufacturing a MEMS microphone will be described in detail with reference to the drawings.

Figure 8:
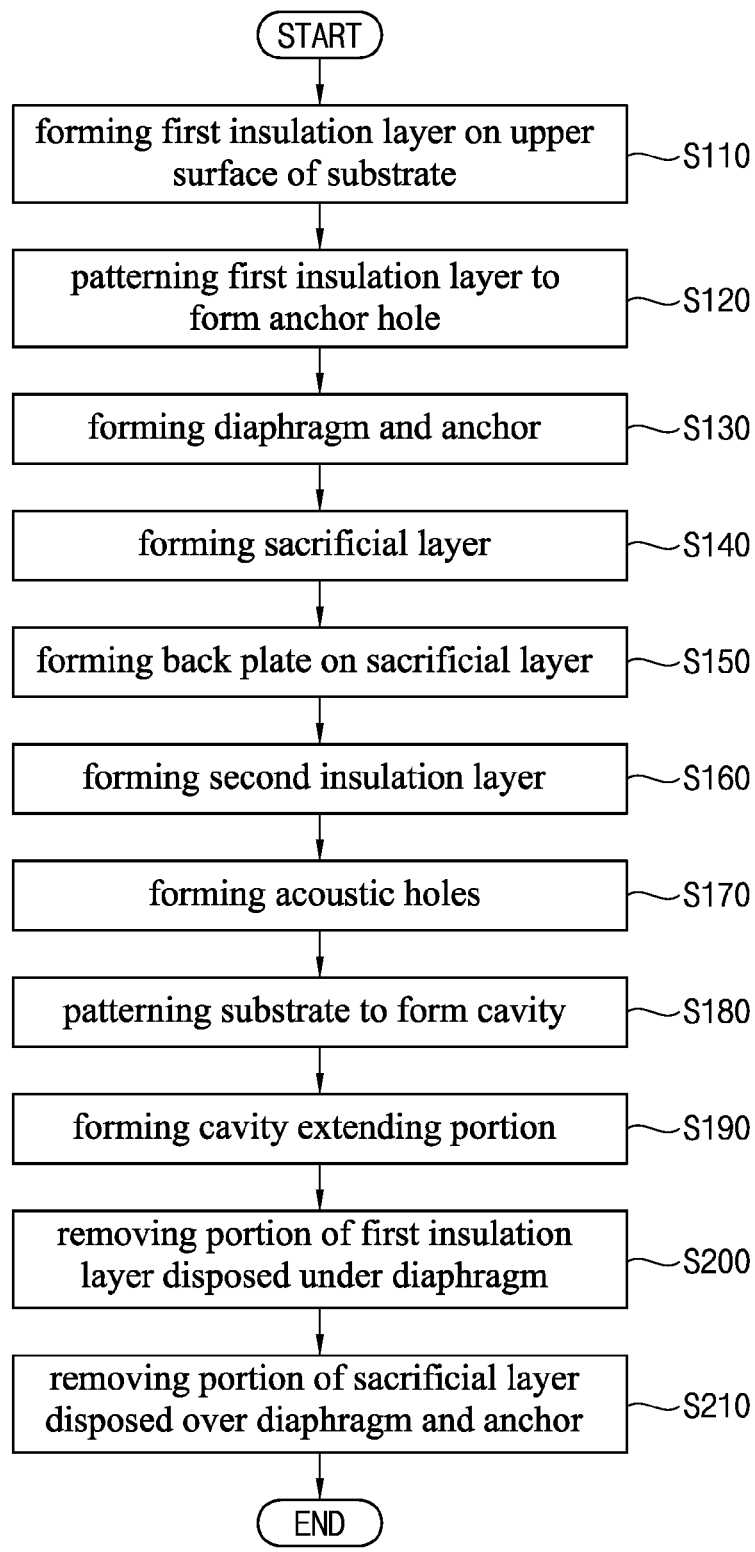
FIG. 8 is a flow chart illustrating a method of manufacturing a MEMS microphone in accordance with an embodiment of the present invention.
Figure 9:
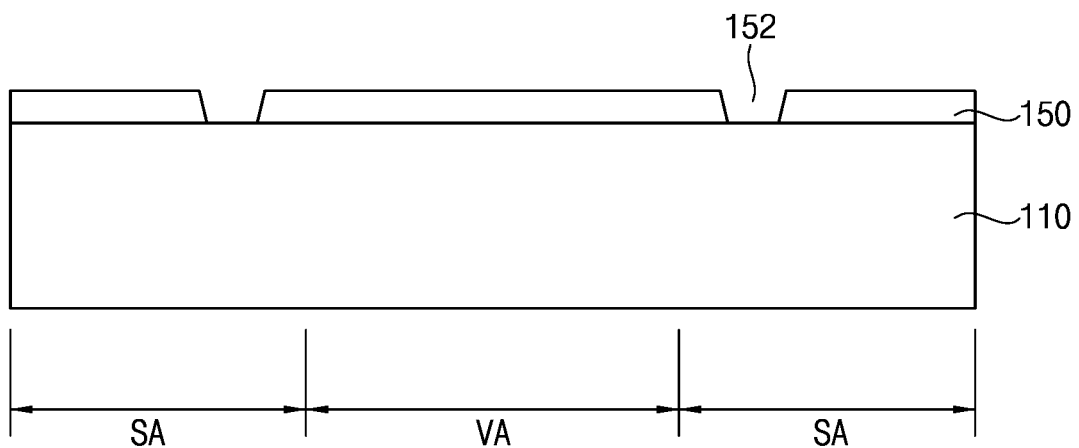
FIGS. 9, 11 and 12 are cross sectional views illustrating a method of manufacturing a MEMS microphone in accordance with an embodiment of the present invention.
Figure 10:
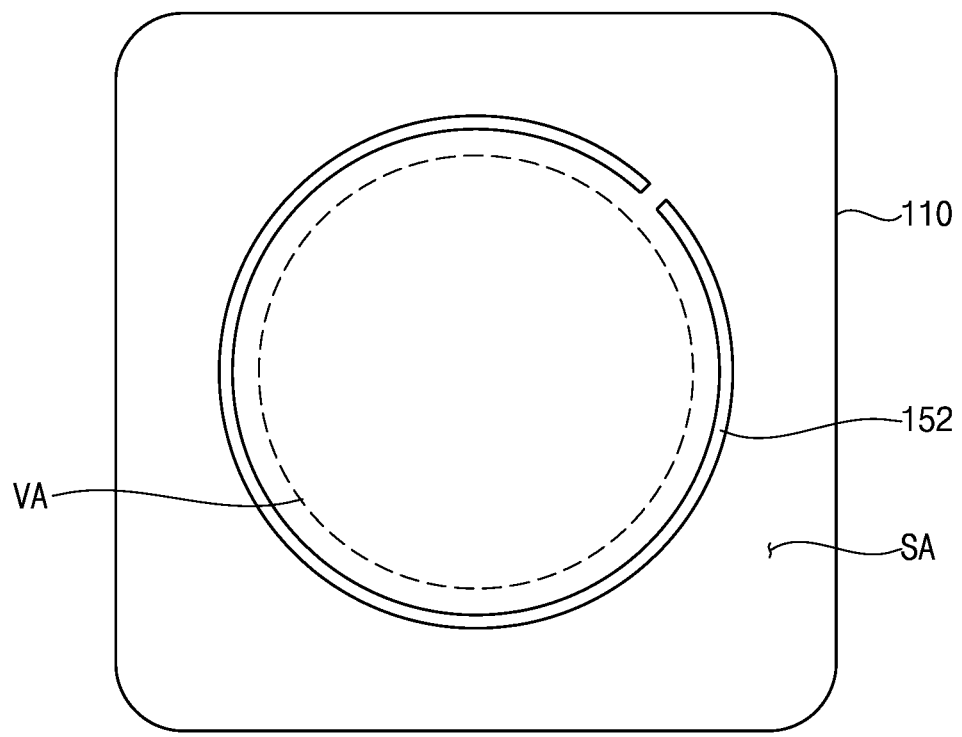
FIG. 10 is a plan view illustrating the first insulation layer in FIG. 9.
Figure 11:
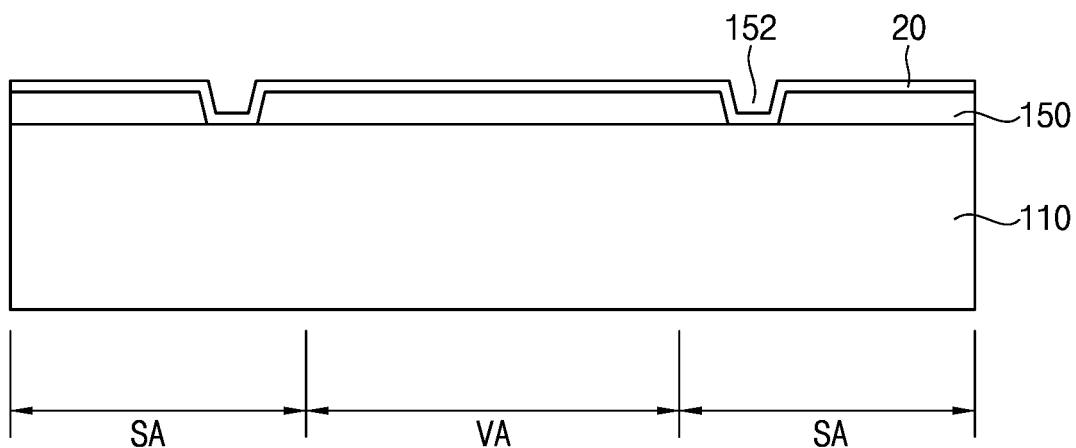
Figure 12:
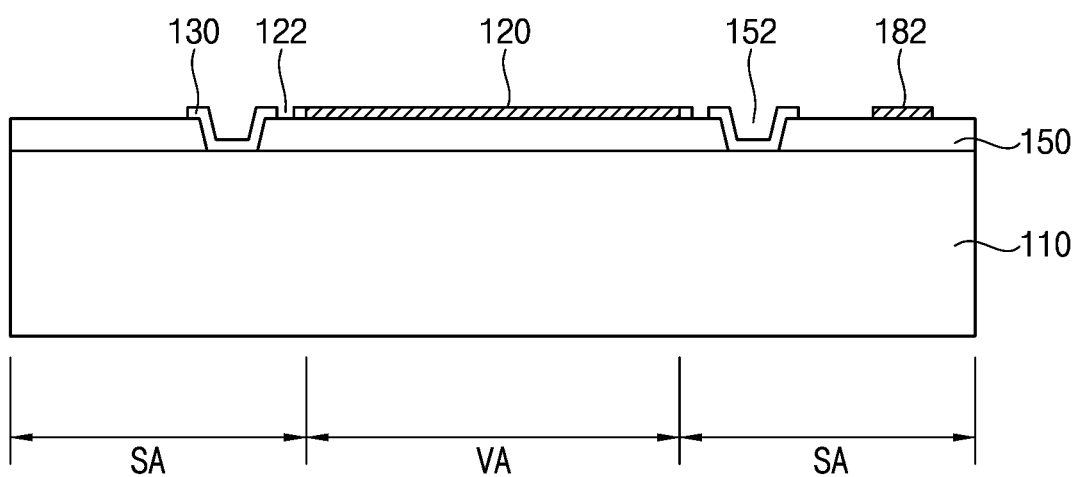

FIG. 8 is a flow chart illustrating a method of manufacturing a MEMS microphone in accordance with an example embodiment of the present invention. FIGS. 9, 11 and 12 are cross sectional views illustrating a method of manufacturing a MEMS microphone in accordance with an example embodiment of the present invention. FIG. 10 is a plan view illustrating the first insulation layer in FIG. 9.

Referring to FIGS. 8 to 10, according to an example embodiment of a method for manufacturing a MEMS microphone, a first insulation layer 150 is formed on a substrate 110 (at S110).

Next, the first insulation layer 150 is patterned to form one anchor hole 152 for forming the anchor 130 (see FIG. 2) (at S120). The anchor hole 152 may be formed in the peripheral area SA and the substrate 110 may be partially exposed through the anchor hole 152. The anchor hole 152 extends along a circumference of a vibration area VA, as shown in FIG. 5, and may be formed in a ring shape to surround the vibration area VA. Since the anchor hole 152 extends along the circumference of the vibration area VA, the anchor 130 may be formed in a dam shape in a subsequent step.

Referring to FIGS. 8 and 11, a first silicon layer 20 is formed on the first insulation layer 150 having the anchor hole 152 formed thereon. The first silicon layer 20 may be formed by a chemical vapor deposition process.

Referring to FIGS. 8 and 12, the first silicon layer 20 is patterned to form a diaphragm 120 and an anchor 130 (step S130). Further, the anchor 130 may be formed in the anchor holes 152 and may make contact with the substrate 110.

Prior to patterning the first silicon layer 20, impurities may be doped into the vibration area VA of the first silicon layer 20 through an ion implantation process to form the diaphragm 120 having a relatively low resistance in the vibration area VA.

While patterning the first silicon layer 20, a plurality of vent holes 122 may be further formed. Further, while forming the diaphragm 120 through the ion implantation process, a diaphragm pad 182 may be formed on the first insulation layer 150 and in the peripheral area SA to be electrically connected to the diaphragm 120.

Referring to FIGS. 8 and 12, a sacrificial layer (not shown) is formed on the first insulation layer 150 to cover the diaphragm 120 and the anchor 130 (at S140).

A second silicon layer is formed on the sacrificial layer and the second silicon layer is patterned to form a back plate 140 having dimple holes 144 in the vibration area VA. A back plate pad 184 may be formed in the peripheral area SA as well.

Further, the back plate 140 and the back plate pad 184 may be doped with impurities through an ion implantation process. The sacrificial layer and the first insulation layer 150 are patterned to form a chamber hole (not shown) to partially expose an upper face of the substrate 110 in the peripheral area SA.

A second insulation layer 160 is formed on the sacrificial layer to cover the back plate 140 (at S160).

Even though not shown in detail in drawings, a method of manufacturing a MEMS microphone according to an embodiment of the present invention can include forming the second insulation layer (at S160), and patterning the second insulation layer 160 and the sacrificial layer to form a first contact hole CH1 to expose the diaphragm pad 182. The second insulation layer 160 can also be patterned to form a second contact hole CH2 to expose the back plate pad 184. Further, a first pad electrode 192 and a second pad electrode 194 may be formed on the second insulation layer 160 through which the first and second contact holes CH1 and CH2 are formed.

The second insulation layer 160 and the back plate 140 are patterned to form the acoustic holes 142 through the second insulation layer 160 and the back plate 140 (step S170).

Subsequently, the substrate 110 is patterned to form a cavity 112 in the vibration area VA (at S180).

A cavity extending portion 116 having a second sidewall 117 can be formed from the first sidewall 115 (at S190). The second sidewall 117 is gradually inclined to be downwardly away from a center line of the cavity 112 (see FIG. 2).

In an example embodiment of the present invention, the cavity 112 and the cavity extending portion 116 may be formed in situ. The cavity 112 and the cavity extending portion 116 may be simultaneously formed. For example, the cavity 112 and the cavity extending portion 116 having a plurality of step portions (see FIG. 3) may be formed through a plurality of etching processes. Further, a cavity extending portion 116 (see FIG. 2) having an inclined second sidewall 117 may be formed with the cavity 112 by adjusting a process recipe for the etching process.

An etchant can be supplied to the first insulation layer 150 through the cavity 112 and the cavity extending portion 116 to remove a portion of the first insulation layer 150, located under the diaphragm 120. Only a portion of the second insulation layer 160 located outside the chamber portion 162 remains (at S200).

Subsequently, a portion of the sacrifice layer, located over the diaphragm 120 and the anchor 130 is removed to form the air gap AG (at S210). The vent holes 122 of the diaphragm 120 may serve as a flow path of the etchant for removing the portion of the sacrificial layer. The first insulation layer and the sacrificial layer may be simultaneously removed.

When forming the air gap AG, only a portion of the sacrificial layer existing outside the chamber 162 remains, and a remaining portion is converted into an insulating interlayer 170. As a result, a MEMS microphone 101 shown in FIG. 2 or FIG. 3 may be completely manufactured.

Figure 13:
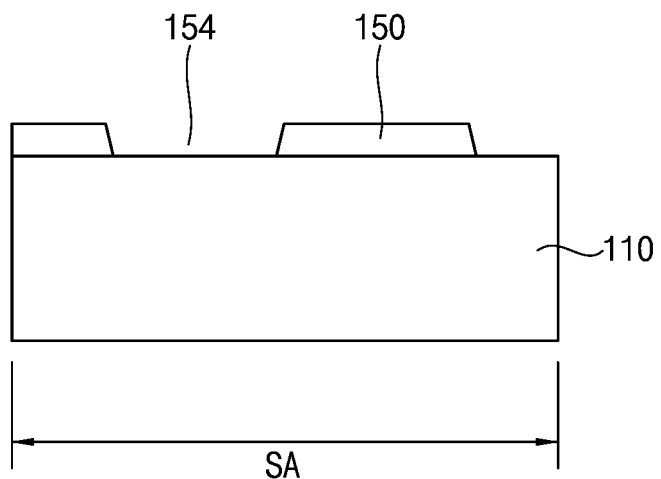
FIGS. 13 to 15 are cross sectional views illustrating a method of manufacturing a MEMS microphone in accordance with an embodiment of the present invention.
Figure 14:
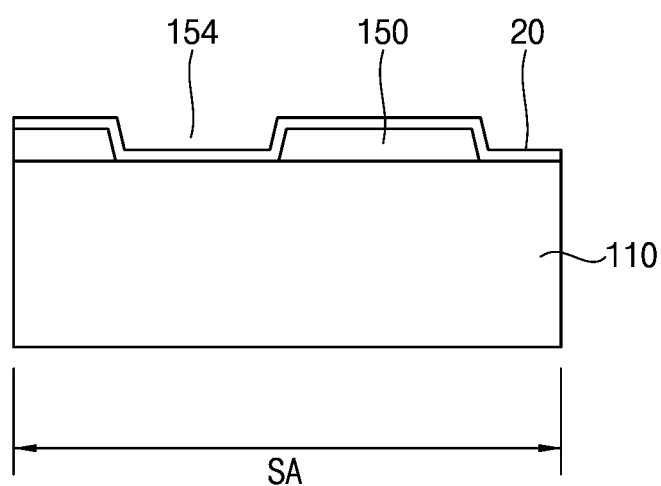
Figure 15:
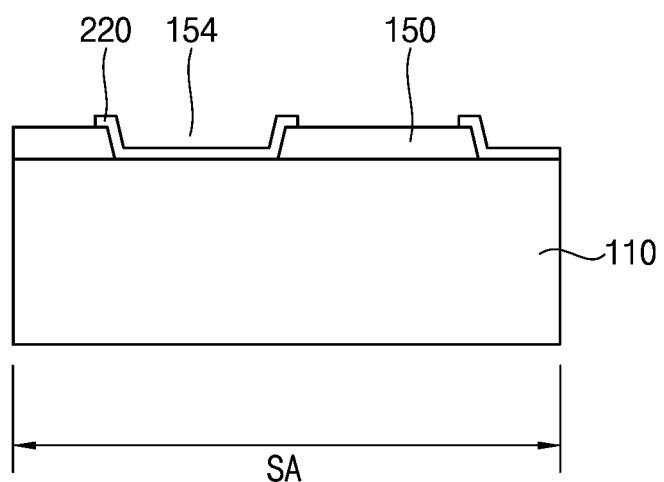
Figure 16:
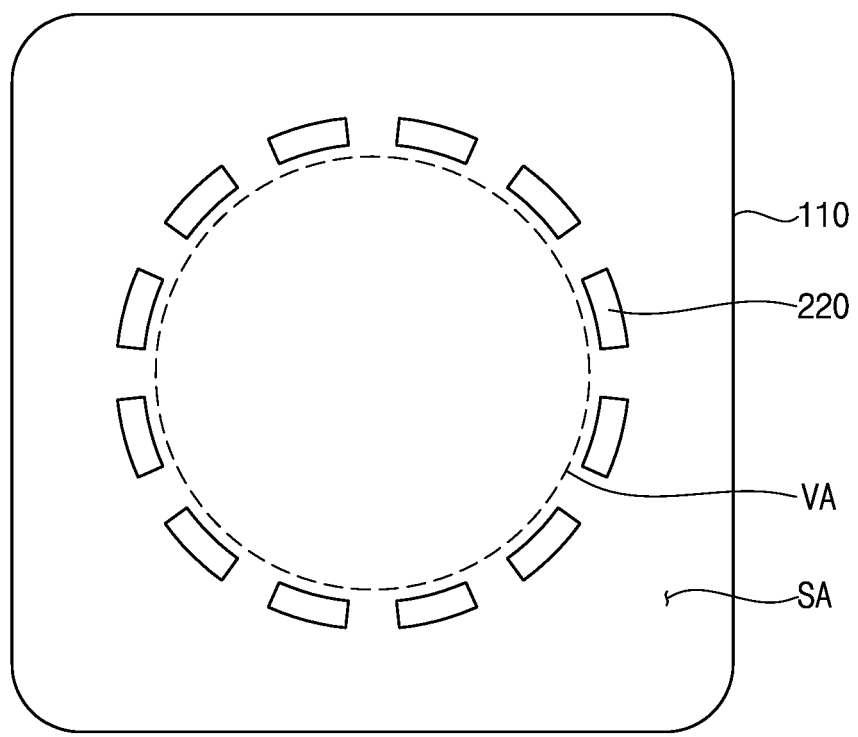
FIG. 16 is a plan view illustrating the anchors in FIG. 15.

FIGS. 13 to 15 are cross sectional views illustrating a method of manufacturing a MEMS microphone in accordance with an example embodiment of the present invention. FIG. 16 is a plan view illustrating the anchors 220 of FIG. 15.

Referring to FIGS. 13 to 16, a method of manufacturing the MEMS microphone 102 includes a plurality of steps identical to those of the method of manufacturing a MEMS microphone explained with reference to FIG. 8 except for forming the diaphragm 210, the anchors 220 and the cavity extending portion 216. A detailed explanation about those elements of the method of manufacturing the MEMS microphone 101 is illustrated with respect to FIG. 8 and will therefore be omitted with respect to FIGS. 13 through 16.

Referring to FIG. 13, a first insulation layer 150 is formed on a substrate 110, and the first insulation layer 150 is patterned to form a plurality of anchor holes 154. The anchor holes 154 may be formed in a peripheral area SA such that the substrate 110 may be partially exposed through the anchor holes 154. The anchor holes 154 may be spaced apart from each other along a periphery of a vibration area VA to surround the vibration area VA (see FIG. 16). In addition, each of the anchor holes 154 is formed to arrange along the vibration area VA. Accordingly, the anchors 220 to be formed in a subsequent process may be formed to have a U-shape, respectively.

Referring to FIG. 14, a first silicon layer 20 is formed on the first insulation layer 150. Then, the first silicon layer 20 is patterned to form the diaphragm 210 (see FIG. 4) and the anchors 220.

As shown in FIGS. 15 and 16, the anchors 220 are formed in the anchor holes 154 and make contact with the substrate 110. The slits 212 are formed between the anchors 220. Hereinafter, processes of forming a sacrificial layer, a back plate, and a second insulation layer are the same or similar to that processes included in the method of manufacturing the MEMS microphone 101 shown in FIG. 8 and will therefore not be repeated.

A cavity 112 and a cavity extending portion 216 may be formed simultaneously using one etching mask (see FIGS. 4 and 6).

Figure 17:
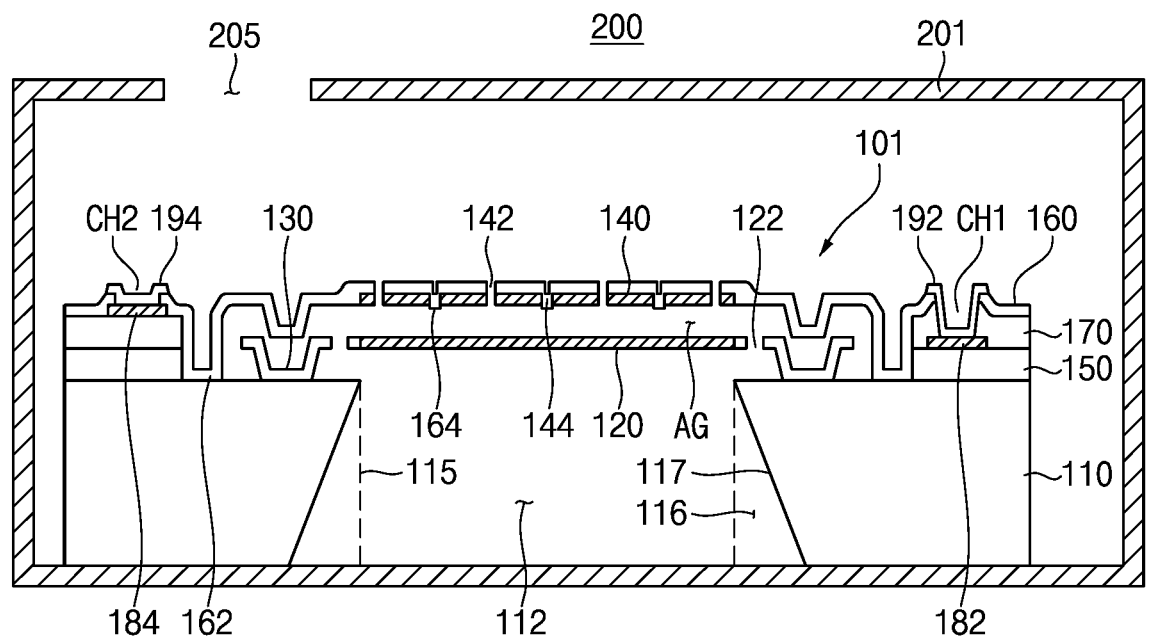
FIG. 17 is a cross sectional view illustrating a MEMS microphone package in accordance with an embodiment of the present invention.

FIG. 17 is a cross sectional view illustrating a MEMS microphone package in accordance with an example embodiment of the present invention.

Referring to FIG. 17, a MEMS microphone package 200 according to an embodiment of the present invention further includes a package portion 201 surrounding the MEMS microphone 101.

The package portion 201 has a top port 205 through which an acoustic pressure may flow. That is, the acoustic pressure may be introduced through the top port 205 and applied to the MEMS microphone 101. At this time, the cavity 112 and the cavity extending portion 116 may function as a back chamber. That is, the back chamber includes the cavity extending portion 116 as well as the cavity 112, such that a volume of the back chamber may be increased. Therefore, increasing the signal-to-noise ratio (SNR) while reducing the compliance may be achieved.

Although the MEMS microphone, the method of manufacturing the MEMS microphone and the MEMS microphone package have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

What is claimed is:

1. A MEMS microphone comprising:
   a substrate defining a cavity including a first sidewall extending a vertical direction;
   a back plate disposed over the substrate and defining a plurality of acoustic holes;

a diaphragm disposed between the substrate and the back plate, the diaphragm being spaced apart from the substrate and the back plate to cover the cavity, the diaphragm configured to sense an acoustic pressure to generate a corresponding displacement;

an anchor extending from a circumference of the diaphragm to connect an end portion of the diaphragm to an upper surface of the substrate, the anchor being connected with the upper surface of the substrate to support the diaphragm; and a cavity extending portion communicating with the cavity to enlarge a volume of a space defined by the cavity, wherein the anchor is one of a plurality of anchors, the plurality of anchors are spaced apart from each other and arranged along a circumference of the diaphragm, and the MEMS microphone further comprises a plurality of slits, wherein each slit of the plurality of slits is arranged between a corresponding pair of the plurality of anchors, and the cavity extending portion includes a third sidewall adjacent to the first sidewall, the third sidewall being disposed below the slits such that the cavity extending portion is provided at all of areas of the first sidewall of the substrate except for portions where the anchors are connected to the substrate.

2. The MEMS microphone of claim 1, wherein the anchor has a ring shape to surround the diaphragm.

3. The MEMS microphone of claim 1, wherein the cavity extending portion includes a second sidewall being inclined and being downwardly more distant from a center line of the cavity.

4. The MEMS microphone of claim 1, wherein the cavity extending portion includes a second sidewall adjacent to the first sidewall, the second sidewall having a plurality of stepped portions which are downwardly more distant from a center line of the cavity.

5. The MEMS microphone of claim 1, wherein the third sidewall is inclined to be downwardly more distant from a center line of the cavity.

6. A method of manufacturing a MEMS microphone comprising:

forming an insulation layer on a substrate that is divided into a vibration area and a peripheral area surrounding the vibration area;

patterning the insulation layer to form an anchor hole for forming an anchor in the peripheral area, the anchor hole extending along a circumference of the vibration area;

forming a diaphragm and an anchor on the insulation layer through which the anchor hole is formed, the anchor connecting the diaphragm to the substrate;

forming a sacrificial layer on the insulation layer to cover the diaphragm and the anchor;

forming a back plate on the sacrificial layer to face the diaphragm;

patterning the back plate to form a plurality of acoustic holes which each penetrate through the back plate;

patterning the substrate to form a cavity defined by a first sidewall in the vibration area;

forming a cavity extending portion communicating with the cavity to enlarge a volume of a space defined by the cavity and the cavity extending portion;

removing a portion of the insulation layer, which is located under the diaphragm, through an etching process using the cavity as a mask; and removing a portion of the sacrificial layer, which corresponds to the diaphragm and the anchor, wherein the anchor is one of a plurality of anchors, the plurality of anchors is spaced apart from each other and is arranged along a circumference of the vibration area, the method further comprising:

forming the diaphragm by forming a plurality of slits such that each slit of the plurality of slits is arranged between a corresponding pair of the plurality of anchors and in the peripheral area, and forming the cavity extending portion by removing a portion of the substrate that is positioned under the slits such that the cavity extending portion is provided at all of areas of the first sidewall of the substrate except for portions where the anchors are connected to the substrate.

7. The method of claim 6, wherein the anchor hole is formed in a ring shape to surround the vibration area, the method further comprising:

forming the diaphragm by forming a plurality of vent holes in the peripheral area, and removing the portion of the sacrificial layer via a flow path passing through the plurality of vent holes.

8. The method of claim 7, wherein forming the cavity extending portion comprises forming a second sidewall being inclined and being downwardly more distant from a center line of the cavity.

9. The method of claim 7, wherein forming the cavity extending portion comprises forming a second sidewall adjacent to the first sidewall, the second sidewall having a plurality of stepped portions which are downwardly more distant from a center line of the cavity.

10. The method of claim 7, wherein the cavity and the cavity extending portion are formed in situ.

11. A MEMS microphone package comprising:

a substrate defining a cavity with a first sidewall extending a vertical direction;

a back plate disposed over the substrate and defining a plurality of acoustic holes;

a diaphragm disposed between the substrate and the back plate, the diaphragm being spaced apart from the substrate and the back plate to cover the cavity, the diaphragm configured to sense an acoustic pressure to generate a corresponding displacement;

an anchor extending from a circumference of the diaphragm to connecting an end portion of the diaphragm to an upper surface of the substrate, the anchor being connected with the upper surface of the substrate to support the diaphragm;

a cavity extending portion communicating with the cavity to enlarge a volume of a space defined by the cavity and the cavity extending portion; and a package portion entirely surrounding the substrate, the back plate, the diaphragm, the anchor and the cavity extending portion, the package portion including a top port which provides a flow path for an acoustic pressure, wherein the anchor is one of a plurality of anchors, the plurality of anchors is spaced apart from each other and arranged along a circumference of the diaphragm, the MEMS microphone further comprises a plurality of slits, wherein each slit of the plurality of slits is arranged between a corresponding pair of the plurality of anchors, and the cavity extending portion includes a third sidewall adjacent to the first sidewall, the third sidewall being disposed below the slits such that the cavity extending portion is provided at all of areas of the first sidewall of the substrate except for portions where the anchors are connected to the substrate.

12. The MEMS microphone package of claim 11, wherein the cavity extending portion includes a second sidewall being inclined and being downwardly more distant from a center line of the cavity.

13. The MEMS microphone package of claim 11, wherein the cavity extending portion includes a second sidewall adjacent to the first sidewall, the second sidewall having a plurality of stepped portions which are downwardly more distant from a center line of the cavity.

* * * * *